United States Patent
Farrenkopf

(12) 
(10) Patent No.: US 6,169,433 B1
(45) Date of Patent: Jan. 2, 2001

(54) METHOD AND APPARATUS USING FEEDBACK TO GENERATE A RAMPED VOLTAGE WITH CONTROLLED MAXIMUM AMPLITUDE

(75) Inventor: Douglas Robert Farrenkopf, Campbell, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/365,968

(22) Filed: Aug. 2, 1999

Related U.S. Application Data

(63) Continuation-in-part of application No. 09/231,046, filed on Jan. 14, 1999, now Pat. No. 6,111,440.

(51) Int. Cl.⁷ ................................................. H03K 4/06
(52) U.S. Cl. ......................................... 327/131; 327/137
(58) Field of Search ................................. 327/131, 132, 327/133, 134, 137, 140, 336, 341, 344, 345, 363

(56) References Cited

U.S. PATENT DOCUMENTS

| | | | |
|---|---|---|---|
| 3,577,007 | 5/1971 | Cross | 327/132 |
| 4,284,906 | 8/1981 | Manfredi | 327/132 |
| 4,384,305 | * 5/1983 | Sonnengerger | 327/131 |
| 4,975,820 | 12/1990 | Szepesi | 363/21 |
| 5,253,155 | 10/1993 | Yamamoto | 363/71 |
| 5,502,410 | * 3/1996 | Dunn et al. | 327/140 |
| 5,513,094 | 4/1996 | Stanley | 363/98 |
| 5,606,296 | * 2/1997 | Seong | 327/172 |
| 5,640,315 | 6/1997 | Hirano et al. | 363/41 |

* cited by examiner

Primary Examiner—Kenneth B. Wells
Assistant Examiner—Paul Dinh
(74) Attorney, Agent, or Firm—Limbach & Limbach, L.L.P.

(57) ABSTRACT

A method and circuit which employs negative feedback to generate a ramped voltage having well controlled maximum amplitude. In preferred embodiments, the invention is an integrated circuit (or portion of an integrated circuit) which generates a ramped voltage with controlled maximum amplitude in a manner independent of process and temperature variations in implementing and operating the circuit. Preferably, the circuit includes an amplifier having an input coupled to receive a reference signal, an output coupled to ramped voltage generator, and another input coupled to the output of the ramped voltage generator, thus implementing a negative feedback loop in which the amplifier asserts feedback to control the maximum amplitude of the ramped voltage generated by the ramped voltage generator. Preferably, the ramped voltage generator periodically charges and discharges a capacitor to generate the ramped voltage, the amplifier is a transconductance amplifier which is periodically enabled (for a portion of each charging cycle of the capacitor) in response to a clock signal, a one-shot circuit produces a delayed voltage pulse train in response to the clock signal, and the ramped voltage generator receives the delayed voltage pulse train and discharges the capacitor in response to each pulse of the delayed voltage pulse train.

29 Claims, 4 Drawing Sheets

METHOD AND APPARATUS USING FEEDBACK TO GENERATE A RAMPED VOLTAGE WITH CONTROLLED MAXIMUM AMPLITUDE

CROSS-REFERENCE TO RELATED APPLICATION

This is a continuation-in-part of application Ser. No. 09/231,046, filed Jan. 14, 1999 now U.S. Pat. No. 6,111,440.

BACKGROUND OF THE INVENTION

1. Field of the Invention

The present invention relates to circuitry for generating ramped voltages having controlled maximum amplitude, and to ramped voltage generation methods performed by such circuitry. Preferred embodiments of the invention are circuits for generating ramped voltage signals (e.g., for use in DC to DC converters) having controlled maximum amplitude.

2. Description of the Related Art

In power supply circuitry, it is often desired to produce ramped voltages. For example, in some DC-DC converters (sometimes referred to as interleaved PWM DC/DC converters, where "PWM" denotes "pulse width modulated"), multiple channels of ramped voltages are provided to comparator circuitry for use in controlling the duty cycle of the DC—DC converter and thus the amplitude of the DC output voltage. The waveforms of the ramped voltages are identical (to the extent possible and practical) except that each has a different phase than the others. An advantage of providing multiple channels of ramped voltages of this type (rather than a single ramped voltage) is that use of multiple channels of PATENT ramped voltages allows the DC/DC converter with parallel power-processing channels to be implemented with smaller power stage inductors, smaller input filter inductors, and smaller output capacitors, thus providing an overall improved step-load transient response and reduced physical size.

More generally, circuitry providing ramped voltage signals (with controlled maximum amplitude) is useful for a wide variety of applications, including but not limited to interleaved PWM DC/DC converter applications. However, when implementing circuitry providing ramped voltage signals with controlled maximum amplitude (especially when implementing it as an integrated circuit or part of an integrated circuit), process and temperature variations typically cause variation from circuit to circuit (or variation over time in a single circuit) in the characteristics (e.g., maximum amplitude) of the ramped voltages.

SUMMARY OF THE INVENTION

In a class of embodiments, the invention is a circuit which employs negative feedback to generate a ramped voltage signal (preferably of a type useful in an interleaved PWM dc/dc converter) having well controlled maximum amplitude. The invention can be implemented as an integrated circuit (or portion of an integrated circuit) which generates a ramped voltage signal with controlled maximum amplitude in a manner independent of process and temperature variations in implementing and operating such integrated circuit. In preferred embodiments, the inventive circuit includes an amplifier (preferably an operational transconductance amplifier) having one input coupled to receive a reference signal indicative of a preselected maximum ramped voltage amplitude, an output coupled to a ramped voltage generation circuit, and another input coupled to the output of the ramped voltage generation circuit. The circuit implements a negative feedback loop in which the amplifier asserts a feedback signal which controls the maximum amplitude of the ramped voltage signal generated by the ramped voltage generation circuity. Preferably, the ramped voltage generation circuit periodically charges and discharges a capacitor to generate the ramped voltage at its output, the amplifier is a transconductance amplifier which is periodically enabled (for a portion of each charging cycle of the capacitor) in response to a clock signal, the invention includes a one-shot circuit which produces a delayed voltage pulse train in response to the clock signal, and the ramped voltage generation circuit receives the delayed voltage pulse train and discharges the capacitor in response to each pulse of the delayed voltage pulse train. The ramped voltage generation circuit is configured to charge or discharge the capacitor by an amount which depends on the feedback signal (which signal is preferably a correction current), and the ramped voltage generation circuit is typically configured to charge the capacitor at a rate which depends on the feedback signal.

The invention can be implemented in a wide variety of applications to generate a ramped voltage signal having well controlled maximum amplitude, for example, in any of a variety of converters having an external clock synchronization input in which it is desirable for an internal voltage ramp (within the converter) to have a maximum amplitude which is independent of frequency.

Another aspect of the invention is a method for generating a ramped voltage signal (preferably of a type useful in an interleaved PWM dc/dc converter) having well controlled maximum amplitude. The method includes the steps of periodically charging and discharging a capacitor to generate the ramped voltage; feeding back the ramped voltage to an amplifier (e.g., an operational transconductance amplifier); periodically enabling the amplifier to generate a correction signal indicative of the difference between the ramped voltage and a reference voltage; and employing the correction signal as negative feedback to control the rate at which the capacitor is charged. Preferably, the amplifier is enabled in response to a clock signal, and the method also includes the steps of generating a delayed voltage pulse train in response to the clock signal, and discharging the capacitor in response to each pulse of the delayed voltage pulse train.

DETAILED DESCRIPTION OF THE PREFERRED EMBODIMENTS

Figure 1:
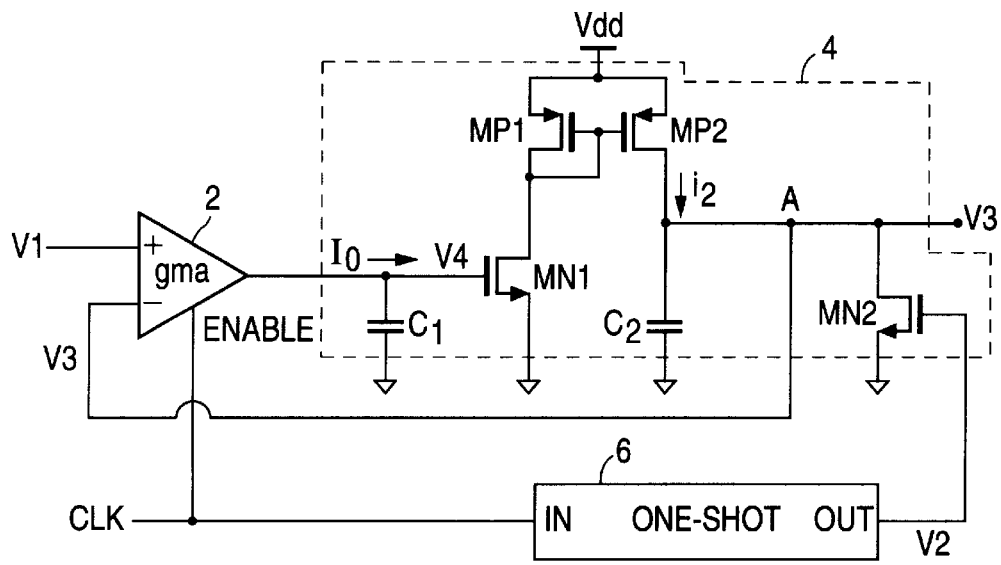
FIG. 1 is a schematic diagram of a preferred embodiment of the inventive circuit.

A preferred embodiment of the inventive circuit will be described with reference to FIG. 1. The FIG. 1 embodiment includes operational transconductance amplifier 2, ramped voltage generation circuit 4 (which produces ramped voltage signal V3 at its output), and one-shot circuit 6, connected as shown. FIG. 2 is a timing diagram showing waveforms of several signals asserted during operation of the circuit of FIG. 1 (each waveform of FIG. 2 is voltage as a function of time).

Amplifier 2 is enabled by rising edges, and disabled by falling edges, of clock signal CLK. Clock signal CLK is a train of voltage pulses (and has a waveform similar or identical to that of the upper waveform of FIG. 2), with the pulses typically occurring with frequency 2.67 MHz (or a lower frequency such as 1 MHz or 100 KHz). In a typical implementation, each pulse typically has 125 nsec (nanosecond) duration. In another typical implementation, each pulse has 30 nsec duration.

Figure 2:
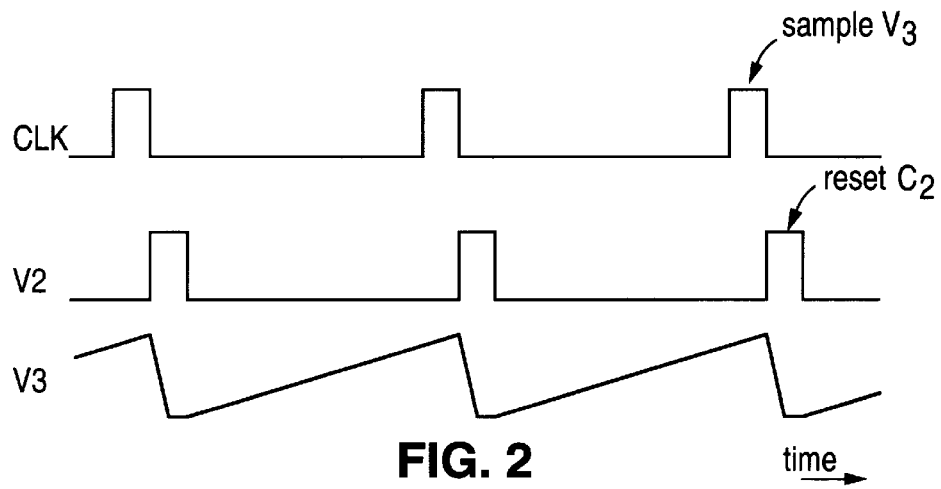
FIG. 2 is a timing diagram showing waveforms of several signals asserted during operation of the circuit of FIG. 1.

The FIG. 1 circuit also includes one-shot circuit 6 which produces a delayed voltage pulse train (signal V2) in response to clock signal CLK. In a typical implementation of circuit 6, the rising edge of each pulse of signal V2 coincides with the falling edge of a pulse of clock signal CLK (as in FIG. 2). Typically, each pulse of signal V2 has the same (or substantially the same) duration as does a corresponding pulse of clock signal CLK (as indicated in FIG. 2). For example, the duration of each pulse of CLK and V2 can be 30 nsec. In some applications, it is desirable to implement one-shot circuit 6 so that each pulse of signal V2 has shorter duration than a corresponding pulse of clock signal CLK (e.g., each pulse of V2 can have duration 10 nsec where each pulse of CLK has duration 125 nsec. In general, each pulse of CLK should have duration which is sufficiently long to allow the feedback loop (including amplifier 2 and elements $C_1$, MN1, MP1, and MP2) to correct the charge rate of capacitor $C_2$ sufficiently to compensate for foreseeable variations in the desired maximum amplitude of signal V3, and each pulse of V2 should have duration which is sufficiently long to allow capacitor $C_2$ to discharge completely (but not significantly longer than such minimum duration).

Circuit 4 of FIG. 1 generates ramped voltage V3 (having waveform similar or identical to that of the lowest waveform of FIG. 2) by cyclically charging and discharging capacitor $C_2$. Capacitor $C_2$ discharges while voltage V2 is high (i.e., when NMOS transistor MN2 is on in response to a high level of voltage V2 at its gate). When voltage V2 is low (so that MN2 is off), capacitor $C_2$ charges in response to the flow of current $i_2$ (current $i_2$ flows from the top rail through the channel of PMOS transistor MP2 to the top plate of capacitor $C_2$).

The FIG. 1 circuit is designed to provide ramped voltage V3 with a maximum amplitude determined (for a given frequency of the pulses of signal V2) by the magnitude of current $i_2$ (in turn determined by the characteristics of capacitor $C_1$, NMOS transistor MN1, and the current mirror comprising transistors MP1 and MP2) and the capacitance $C_2$. However, due to process and temperature variations in implementing and operating FIG. 1 as an integrated circuit (or portion of an integrated circuit), the values of capacitor shift and variation of frequency of clock signals CLK and V2 with process and temperature will directly affect the maximum amplitude of ramped voltage V3. The variation in maximum amplitude (from circuit to circuit, and over time for each circuit implementation of the invention) of the ramped voltage V3 (unless corrected in accordance with the invention) has a number of undesirable consequences.

To alleviate the problems that would otherwise be caused by variation in the maximum amplitude of the ramped voltage signal it produces, the FIG. 1 circuit includes current mirror CM1, operational transconductance amplifier 2, NMOS transistor MN1, and capacitor $C_1$ (connected as shown) in accordance with the invention. A reference signal V1, which is indicative of a desired (pre-selected) maximum amplitude for ramped voltage signal V3, is provided to the noninverting input of amplifier 2. The ramped voltage signal V3 is fed back to the inverting input of amplifier 2. In response, current $I_o$ (whose magnitude depends on the difference between reference signal V1 and the instantaneous level of ramped voltage signal V3) flows to (or from) the output of amplifier 2 from (or to) the top plate of capacitor $C_1$. The output current $I_o$ of amplifier 2 is negative feedback which is used in a negative feedback loop which tends to move the level of the ramped voltage signal toward the desired maximum amplitude.

Current mirror CM1 comprises PMOS transistors MP1 and MP2 connected as shown (with their sources at the top rail potential $V_{dd}$, and the gates of MP1 and MP2 and the drain of MP1 connected to the drain of NMOS transistor MN1).

Next, the operation of the maximum amplitude correction circuitry of the invention is explained in more detail with reference to FIG. 1. When CLK goes high, amplifier 2 is enabled and a feedback loop comprising amplifier 2, capacitor $C_1$, transistor MN1, the current mirror comprising MP1 and MP2, and output node A (whose potential determines voltage signal V3) is established. Capacitor $C_1$ charges or discharges at a rate which depends on the value of current $I_o$.

If V1>V3 while amplifier 2 is enabled, then current $I_o$ flows from amplifier 2 to the top plate of capacitor $C_1$, thus raising the gate potential of transistor MN1. In response, the current through the channel of transistor MP2 increases, and thus the voltage across capacitor $C_2$ (and thus the level of V3) increases at greater rate than it would if $I_o$ were zero ($I_o$=0 when amplifier 2 is disabled). In other words, while amplifier 2 is enabled (during a short interval of time immediately before capacitor $C_2$ discharges), if V1 is greater than V3, then the value of current $I_o$ is negative feedback which causes the current mirror to raise the level of ramped voltage signal V3 more rapidly (toward the desired maximum amplitude) than if $I_o$ were zero.

If V1<V3 while amplifier 2 is enabled, then amplifier 2 sinks a positive current $I_o$ from the top plate of capacitor $C_1$, thus lowering the gate potential of transistor MN1. In response, the current through the channel of transistor MP2 decreases, and thus the voltage across capacitor $C_2$ (and thus the level of V3) increases at lower rate than it would if $I_o$ were zero (as when amplifier 2 is disabled). In other words, while amplifier 2 is enabled (during a short interval of time immediately before capacitor $C_2$ discharges), if V1 is less than V3, then the value of current $I_o$ is negative feedback which causes the current mirror (MP1 and MP2) to raise the level of ramped voltage signal V3 less rapidly (toward the desired maximum amplitude) than if $I_o$ were zero.

Figure 5:
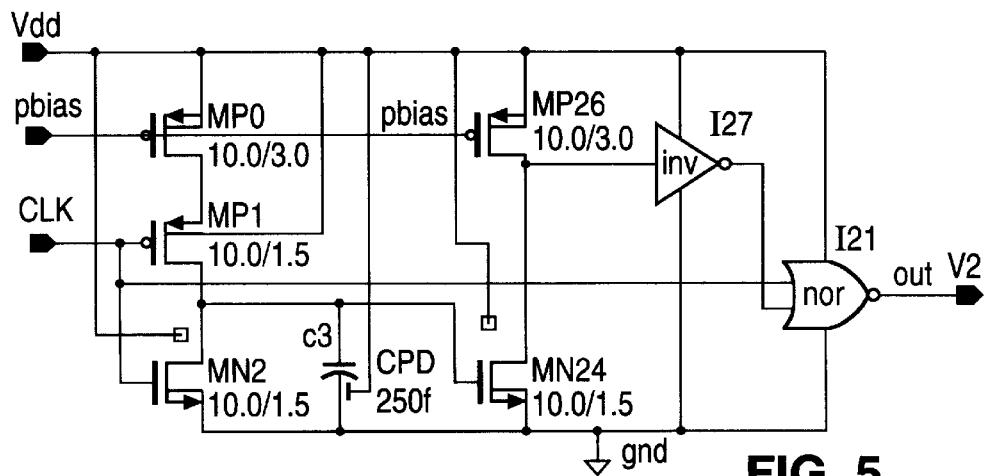
FIG. 5 is a schematic diagram of an implementation of the one-shot circuit of FIG. 3.
Figure 3:
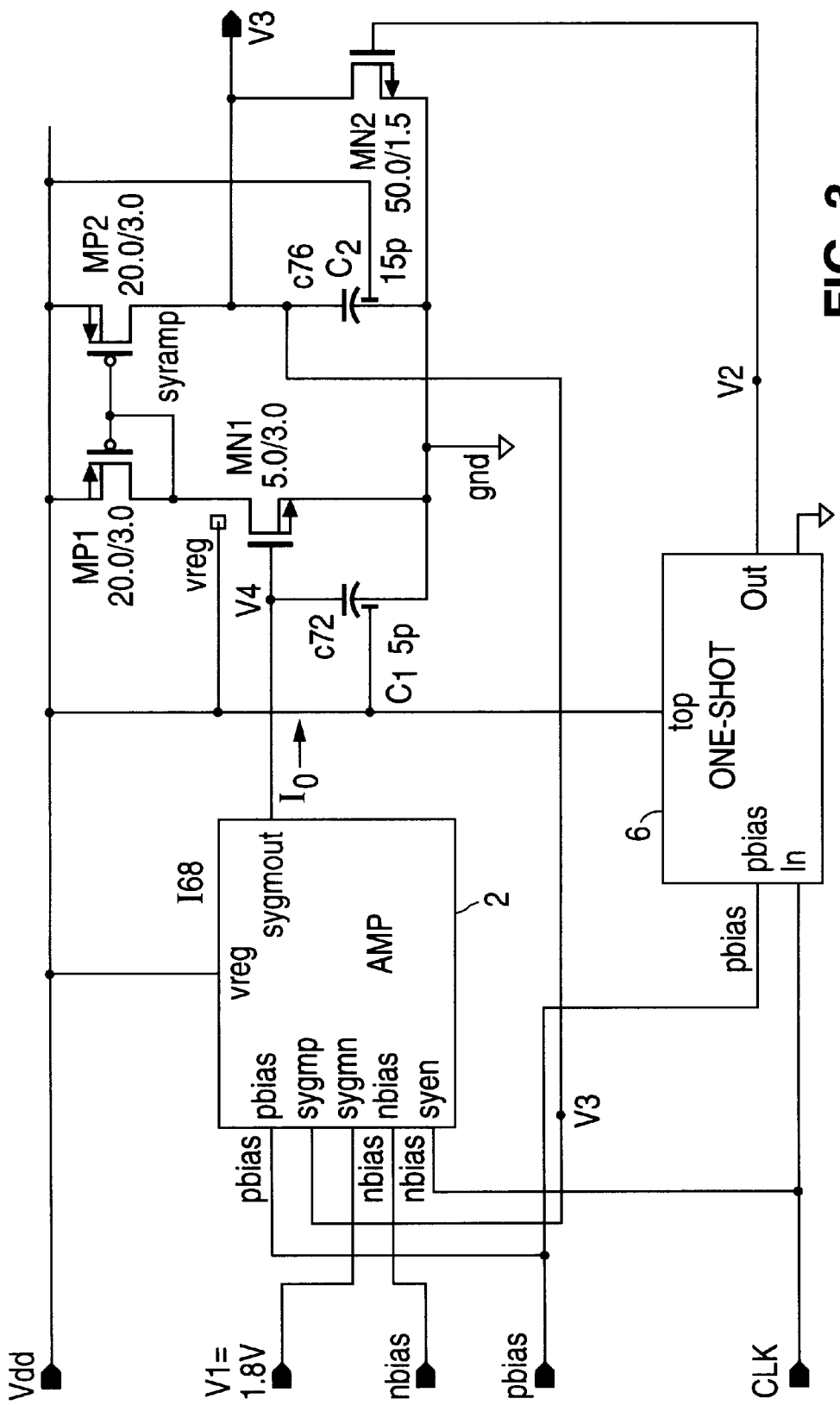
FIG. 3 is a schematic diagram of an implementation of the FIG. 1 embodiment.
Figure 4:
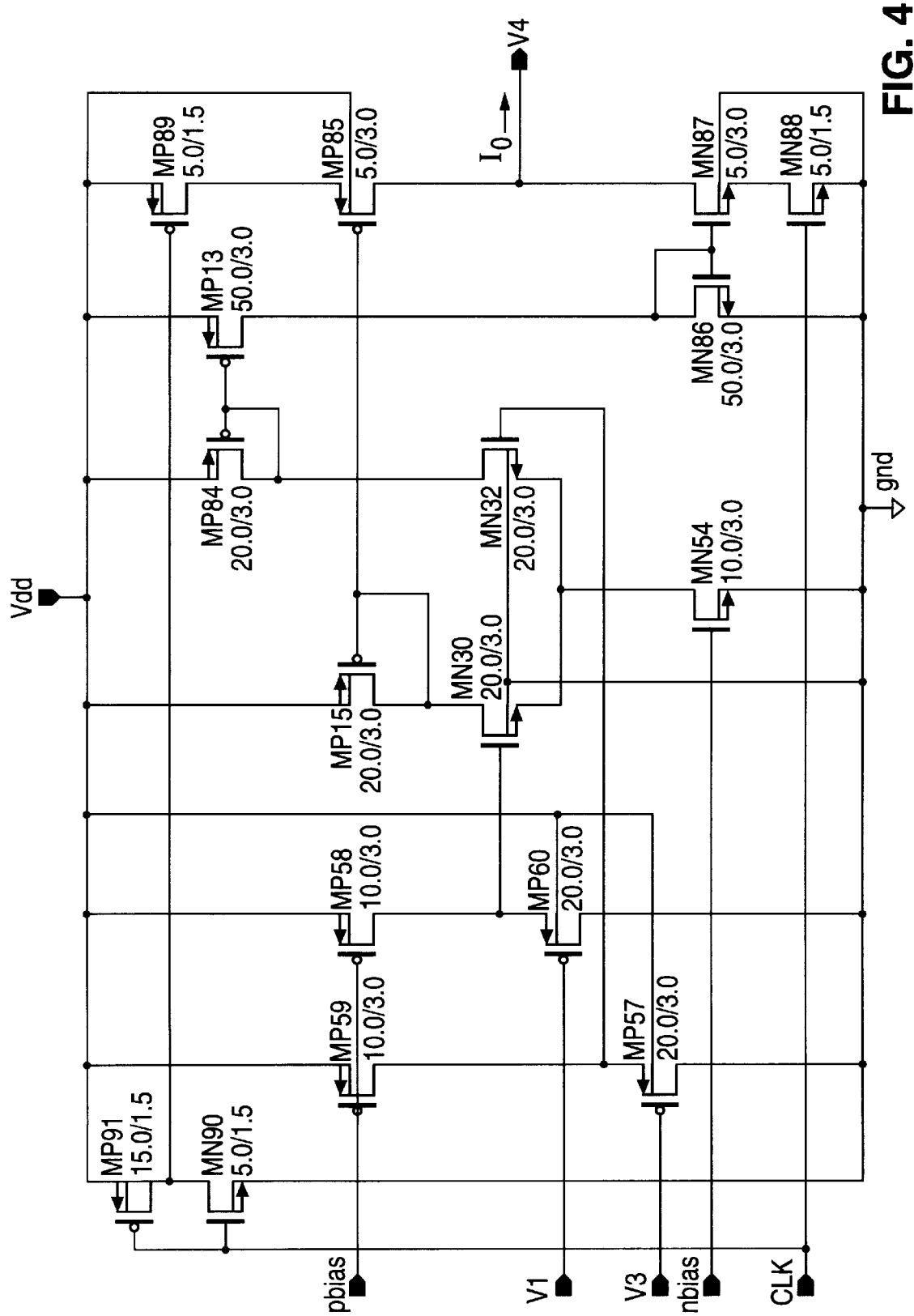
FIG. 4 is a schematic diagram of an implementation of the transconductance amplifier of FIG. 3.

With reference to FIGS. 3–5, we next describe a typical integrated circuit implementation of the FIG. 1 embodiment. FIG. 3 is a schematic diagram of the circuit. FIG. 4 is a schematic diagram of an implementation of transconductance amplifier 2 of FIG. 3. FIG. 5 is a schematic diagram of an implementation of one-shot circuit 6 of FIG. 3 (which produces delayed voltage pulse train V2 (whose pulses have width 30 nsec) in response to clock signal CLK (whose pulses also have width 30 nsec).

The characteristics of the components and reference signals of the circuit of FIGS. 3–5 are indicated (for example, capacitor $C_1$ has a capacitance of 5 picoFarads, capacitor $C_2$ has a capacitance of 15 picoFarads, capacitor $C_{PD}$ of FIG. 5 has a capacitance of 250 femtoFarads, reference potential V1 is 1.8 volts above ground, and each of the transistors shown in FIGS. 3–5 is a MOSFET transistor having channel width to length ratio as indicated, where the indicated widths and lengths are in microns). Those of ordinary skill in the art will appreciate what are appropriate levels for bias potentials pbias and nbias, and regulated top rail potential $V_{dd}$, in view of the present disclosure. The top rail potential $V_{dd}$ is typically in the range from 1.5 to 10 volts above ground ($V_{dd}$ is 2.8 volts above ground in the example shown in the Figures), and the pulses (i.e., the rising edges) of signal CLK typically occur with frequency 3 MHz or less.

Transconductance amplifier 2 of FIG. 4 is implemented so that it is capable of responding rapidly to an enabling signal (a rising edge of the "CLK" signal). In response to a rising edge of the CLK signal, transistors MN88 and MP89 rapidly turn on, and diode-connected NMOS transistor MN86 (whose gate and drain are coupled to the gate of NMOS transistor MN87) and diode-connected PMOS transistor MP1 5 (whose gate and drain are coupled to the gate of PMOS transistor MP85) set the gate potentials of transistors MN87 and MP85 (during the charging portion of the operating cycle) to levels which result in the appropriate (positive or negative) output current $I_o$ flow from the output node (the common drains of MP85 and MN85). Since the gate potentials of MP85 and MN87 are set during the charging portion of the operating cycle, they need not be set rapidly and the transconductance amplifier thus does not need to be extremely fast. Since transistors MN88 and MP89 rapidly turn on (in response to a rising edge of CLK), current can travel in transistors MN87 and MP85 for only a brief portion of each cycle of operation.

One-shot circuit 6 of FIG. 5 has a conventional design, in which the output potential V2 is the output of a NOR gate, one of the inputs of the NOR gate is the output of an inverter (whose input is the common drain of PMOS transistor MP26 and NMOS transistor MN24), and the other of the inputs of the NOR gate is coupled to receive the CLK signal. Capacitor $C_{PD}$ is coupled between the gate and source of transistor MN24. Transistor MP0 is a current source transistor (the current through its channel is set by the potential "pbias").

Figure 6:
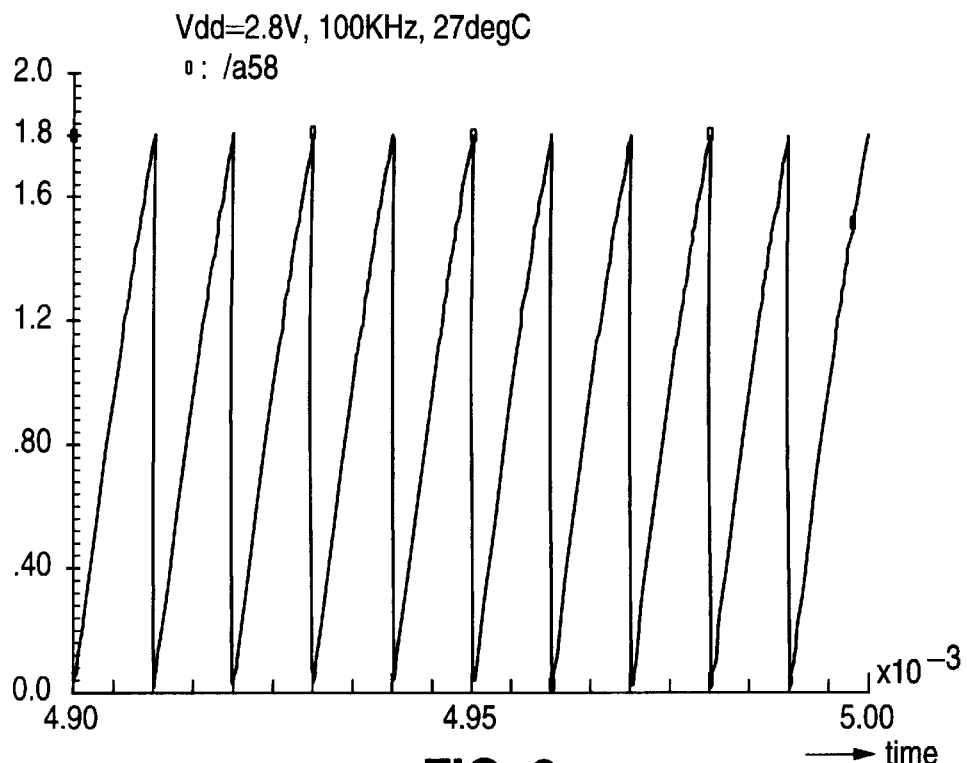
FIG. 6 is a graph of simulated output potential V3 for the FIG. 3 circuit (in response to a CLK signal having waveform as shown in FIG. 2 and a frequency of 100 KHz, with V1=1.8 Volts and $V_{dd}$=2.8 volts).
Figure 7:
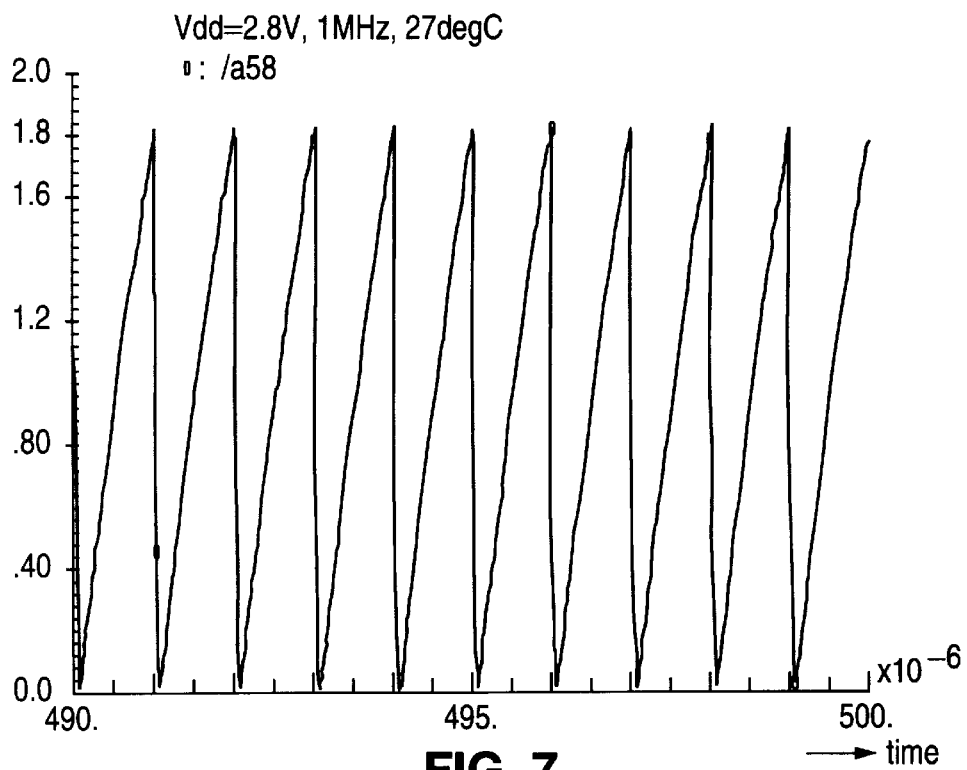
FIG. 7 is a graph of simulated output potential V3 for the FIG. 3 circuit (in response to a CLK signal having waveform as shown in FIG. 2 and a frequency of 1 MHz, with V1=1.8 Volts and $V_{dd}$=2.8 volts).

Simulations (using SPICE software) have confirmed that the invention, implemented as in FIGS. 3–5 (with V1=1.8 Volts, $V_{dd}$=2.8 volts, and the rising edges of signal CLK occurring with frequency of either 100 KHz or 1 MHz), can produce output signal V3 with a ramped (sawtooth) waveform with substantially linear ramp slope, and with well controlled maximum amplitude equal to about 1.8 Volts. Results of the simulations are shown in FIG. 6 (for CLK frequency=100 KHz) and in FIG. 7 (for CLK frequency=1 MHz).

Although only a preferred embodiment has been described in detail herein, those having ordinary skill in the art will certainly understand that many modifications are possible without departing from the teachings hereof. For example, one or both of capacitors $c_1$ and $C_2$ can be replaced by a set of two or more capacitors connected in parallel. All such modifications are intended to be encompassed within the following claims.

What is claimed is:

1. A circuit for generating a ramped voltage at an output node such that the ramped voltage has a controlled maximum amplitude, the circuit including:

a ramped voltage generation circuit, including at least one capacitor coupled to the output node and circuitry configured to charge and discharge the at least one capacitor in controlled fashion to produce the ramped voltage at the output node; and an amplifier having a first input coupled to receive a reference signal, a second input coupled to the output node to receive the ramped voltage, an amplifier output node coupled to the ramped voltage generation circuit, and an enable node coupled to receive an enable signal, wherein the reference signal has a level indicative of a preselected maximum amplitude for the ramped voltage, and wherein the amplifier is configured to produce a correction current at the amplifier output node, in response to being enabled by the enable signal, wherein the correction current has a magnitude which depends on the difference between the level of the reference signal and a level of the ramped voltage, wherein the ramped voltage generation circuit is configured to charge or discharge the at least one capacitor by an amount which depends on the correction current.

2. The circuit of claim 1, wherein the enable signal is a clock signal, the amplifier is configured to enter an enabled state followed by a disabled state in response to each pulse of the clock signal, and the circuit also includes:

a one-shot circuit having an input coupled to receive the clock signal and an output coupled to the ramped voltage generation circuit, wherein the one-shot circuit is configured to produce a delayed voltage pulse train in response to the clock signal, and the ramped voltage generation circuit is configured to discharge the at least one capacitor in response to each pulse of the delayed voltage pulse train.

3. The circuit of claim 1, wherein said circuit is an integrated circuit, and the integrated circuit is configured to generate the ramped voltage to have a maximum amplitude which is at least substantially independent of process and temperature variations in implementing and operating said integrated circuit.

4. The circuit of claim 1, wherein said circuit is a portion of an integrated circuit, and the integrated circuit is configured to generate the ramped voltage to have a maximum amplitude which is at least substantially independent of process and temperature variations in implementing and operating said integrated circuit.

5. The circuit of claim 1, wherein the amplifier is an operational transconductance amplifier.

6. The circuit of claim 1, wherein the ramped voltage generation circuit is configured to periodically charge and discharge the at least one capacitor to generate the ramped voltage, the enable signal is a clock signal comprising a train of pulses, the amplifier is configured to enter an enabled state followed by a disabled state in response to each of the pulses of the clock signal, and the circuit also includes:

a one-shot circuit having an input coupled to receive the clock signal and an output coupled to the ramped voltage generation circuit, wherein the one-shot circuit is configured to produce a delayed voltage pulse train in response to the clock signal, and the ramped voltage generation circuit is configured to discharge the at least one capacitor in response to each pulse of the delayed voltage pulse train.

7. The circuit of claim 6, wherein the ramped voltage generation circuit is configured to periodically charge and discharge the at least one capacitor in a cycle that includes an initial charging period, a final charging period after the initial charging period, and a discharging period after the final charging period, and wherein the clock signal and the delayed voltage pulse train have a common frequency but a relative phase such that the amplifier is enabled only during each said final charging period.

8. The circuit of claim 1, wherein the amplifier is configured to source the correction current to the amplifier output node when the reference signal has a level exceeding an instantaneous level of the ramped voltage, and to sink the correction current from the amplifier output node when the instantaneous level of the ramped voltage exceeds the level of the reference signal.

9. The circuit of claim 1, wherein the ramped voltage generation circuit is configured to periodically charge and discharge the at least one capacitor to generate the ramped voltage, the enable signal is a clock signal comprising a train of pulses, the amplifier is configured to enter an enabled state followed by a disabled state in response to each of the pulses of the clock signal, and the ramped voltage generation circuit includes:

a first circuit including a control capacitor having a first conducting element coupled to the amplifier output node and a second conducting element, wherein the first circuit is configured to cause flow at a first node of a control current, the control current having a level determined by the potential difference between the first conducting element and the second conducting element; and current mirror circuitry, coupled between the first node and the at least one capacitor, and configured to assert a charging current to said at least one capacitor, wherein the charging current has a level determined by the level of the control current.

10. The circuit of claim 9, wherein the first circuit includes:

a MOSFET transistor having a gate connected to the first conducting element and a transistor channel connected to the first node, and wherein the control current flows through the transistor channel.

11. The circuit of claim 1, wherein the ramped voltage generation circuit is configured to charge the capacitor at a rate which depends on the correction current.

12. A circuit for generating a ramped voltage at an output node such that the ramped voltage has a controlled maximum amplitude, the circuit including:

a ramped voltage generation circuit, including a first capacitor coupled to the output node and circuitry configured to charge and discharge the first capacitor in controlled fashion to produce the ramped voltage at the output node; and an amplifier having a first input coupled to receive a reference signal, a second input coupled to the output node to receive the ramped voltage, an amplifier output node coupled to the ramped voltage generation circuit, and an enable node coupled to receive an enable signal, wherein the reference signal has a level indicative of a preselected maximum amplitude for the ramped voltage, and wherein the amplifier is configured to produce a correction current at the amplifier output node, in response to being enabled by the enable signal, wherein the correction current has a magnitude which depends on the difference between the level of the reference signal and a level of the ramped voltage, wherein the circuitry configured to charge and discharge the first capacitor includes charging circuitry and a first switch, wherein the charging circuitry is configured to charge the first capacitor at a first rate when the amplifier is disabled and to charge the first capacitor at a variable rate when the amplifier is enabled, wherein the variable rate has an instantaneous value which depends on the correction current, and wherein the first switch is coupled between ground and the output node, whereby the charging circuitry charges the first capacitor when the first switch is in an open state, and the first capacitor discharges when the first switch is in a closed state.

13. The circuit of claim 12, wherein the enable signal is a clock signal, the amplifier is configured to enter an enabled state followed by a disabled state in response to each pulse of the clock signal, and the circuit also includes:

a one-shot circuit having an input coupled to receive the clock signal and an output coupled to the first switch, wherein the oneshot circuit is configured to produce a delayed voltage pulse train in response to the clock signal, and the first switch is configured to enter the closed state followed by the open state in response to each pulse of the delayed voltage pulse train.

14. The circuit of claim 12, wherein said circuit is an integrated circuit, and the integrated circuit is configured to generate the ramped voltage to have a maximum amplitude which is at least substantially independent of process and temperature variations in implementing and operating said integrated circuit.

15. The circuit of claim 12, wherein said circuit is a portion of an integrated circuit, and the integrated circuit is configured to generate the ramped voltage to have a maximum amplitude which is at least substantially independent of process and temperature variations in implementing and operating said integrated circuit.

16. The circuit of claim 12, wherein the ramped voltage generation circuit is configured to periodically charge and discharge the first capacitor to generate the ramped voltage, the enable signal is a clock signal comprising a train of pulses, the amplifier is configured to enter an enabled state followed by a disabled state in response to each of the pulses of the clock signal, and the circuit also includes:

a one-shot circuit having an input coupled to receive the clock signal and an output coupled to the ramped voltage generation circuit, wherein the one-shot circuit is configured to produce a delayed voltage pulse train in response to the clock signal, and the first switch is configured to enter the closed state followed by the open state in response to each pulse of the delayed voltage pulse train.

17. The circuit of claim 16, wherein the ramped voltage generation circuit is configured to periodically charge and discharge the first capacitor in a cycle that includes an initial charging period, a final charging period after the initial charging period, and a discharging period after the final charging period, and wherein the clock signal and the delayed voltage pulse train have a common frequency but a relative phase such that the amplifier is enabled only during each said final charging period.

18. The circuit of claim 16, wherein the amplifier is an operational transconductance amplifier.

19. The circuit of claim 12, wherein the amplifier is configured to source the correction current to the amplifier output node when the reference signal has a level exceeding an instantaneous level of the ramped voltage, and to sink the correction current from the amplifier output node when the instantaneous level of the ramped voltage exceeds the level of the reference signal.

20. The circuit of claim 12, wherein the charging circuitry includes:

first circuitry including a control capacitor having a first conducting element coupled to the amplifier output node and a second conducting element, wherein the first circuitry is configured to cause flow at a first node of a control current, the control current having a level determined by the potential difference between the first conducting element and the second conducting element; and current mirror circuitry, coupled between the first node and the first capacitor, and configured to assert a charging current to said first capacitor, wherein the charging current has a level determined by the level of the control current.

21. The circuit of claim 20, wherein the first circuitry includes:

a MOSFET transistor having a gate connected to the first conducting element and a transistor channel connected to the first node.

22. A method for generating a ramped voltage such that the ramped voltage has a controlled maximum amplitude, said method including the steps of:

cyclically charging and discharging a capacitor to produce the ramped voltage at an output node, including by providing a charging current to the capacitor during each operation of charging said capacitor, wherein the charging current has a fixed value during a first portion of said each operation of charging the capacitor;

generating a correction current during a second portion of said each operation of charging the capacitor, by enabling an amplifier during the second portion of said each operation of charging the capacitor while feeding back the ramped voltage to the amplifier and asserting a reference signal to the amplifier, said reference signal having a level indicative of a preselected maximum amplitude for the ramped voltage, wherein the correction current has a magnitude which depends on the difference between the level of the reference signal and a level of the first ramped voltage; and controlling the charging current in response to the correction current during the second portion of said each operation of charging the capacitor so as to correct the amplitude of the ramped voltage to reduce any difference between said amplitude of the ramped voltage and the preselected maximum amplitude.

23. A method for generating a ramped voltage having controlled maximum amplitude, including the steps of:

(a) periodically charging and discharging at least one capacitor to generate the ramped voltage;

(b) while performing step (a), feeding back the ramped voltage to an amplifier;

(c) while performing step (a), periodically enabling the amplifier while the at least one capacitor is charging and then disabling the amplifier such that, during each period in which the amplifier is enabled, the enabled amplifier generates a correction signal indicative of the difference between the ramped voltage and a reference voltage;

(d) employing the correction signal as negative feedback to control the rate at which at least one capacitor is charged.

24. The method of claim 23, wherein the correction signal generated during step (c) is an output current of said amplifier.

25. The method of claim 23, wherein step (c) includes the step of enabling and then disabling the amplifier in response to each pulse of a clock signal, said method also including the steps of:

generating a delayed voltage pulse train in response to the clock signal.

26. The method of claim 25, wherein step (a) includes the step of discharging the at least one capacitor in response to each pulse of the delayed voltage pulse train.

27. The method of claim 26, wherein step (a) includes the step of periodically charging and discharging the at least one capacitor in a cycle that includes an initial charging period, a final charging period after the initial charging period, and a discharging period after the final charging period, and wherein the clock signal and the delayed voltage pulse train have a common frequency but a relative phase such that the amplifier is enabled only during each said final charging period.

28. The method of claim 23, wherein step (d) includes the steps of:

(e) asserting the correction signal to a second capacitor having a first conducting element coupled to the amplifier and a second conducting element; and (f) causing flow at a first node of a control current, the control current having a level determined by the potential difference between the first conducting element and the second conducting element; and (g) asserting a charging current to the at least one capacitor, wherein the charging current has a level determined by the level of the control current.

29. The method of claim 28, wherein step (f) includes the step of varying a gate potential of the MOSFET device in response to a control signal, wherein the control signal has a level determined by the potential difference between the first conducting element and the second conducting element.

* * * * *